United States Patent [19]
Bergmann

[11] Patent Number: 5,792,519
[45] Date of Patent: Aug. 11, 1998

[54] METHOD FOR THE PLASMA ASSISTED HIGH VACUUM PHYSICAL VAPOR COATING OF PARTS WITH WEAR RESISTANT COATINGS AND EQUIPMENT FOR CARRYING OUT THE METHOD

[76] Inventor: Erich Bergmann, Klingnaustrasse 3, CH-4058 Basel, Switzerland

[21] Appl. No.: 674,505

[22] Filed: Jul. 2, 1996

[30] Foreign Application Priority Data

Jul. 4, 1995 [CH] Switzerland ............ 01 944/95

[51] Int. Cl.$^6$ ............................................. C23C 16/02
[52] U.S. Cl. .............. 427/534; 427/535; 427/573; 427/248.1; 427/314; 427/318; 427/398.4; 427/398.5
[58] Field of Search ................. 427/541, 542, 427/543, 545, 557, 569, 573, 248.1, 314, 318, 398.4, 398.5, 534, 535

[56] References Cited

U.S. PATENT DOCUMENTS

| | | | |
|---|---|---|---|
| 4,749,587 | 6/1988 | Bergmann et al. | 427/37 |
| 4,789,333 | 12/1988 | Hemsath | 432/176 |
| 5,403,628 | 4/1995 | König et al. | 427/569 |
| 5,487,922 | 1/1996 | Nieh et al. | 427/528 |

FOREIGN PATENT DOCUMENTS 2185976  7/1990  Japan.

OTHER PUBLICATIONS

Falbe et al., Rompp Chemie Lexikon, New York. pp. 4854–4855 (for definitions of "rough", medium, and high vacuums). No available date.

*Primary Examiner*—Shrive Beck
*Assistant Examiner*—Timothy Meeks
*Attorney, Agent, or Firm*—Larson & Taylor

[57] ABSTRACT

The present invention relates to a novel method for the plasma assisted high vacuum vapor coating of parts with wear resistant coatings where the method comprises at least the process steps heating and conditioning and where the process step conditioning comprises heating. A protective gas is used for the heating. It is circulated at a pressure of at least 0.01 bar. Significant advantages are realized over state of the art methods using radiation heating. The method is preferentially carried out in an apparatus conceived for it, which comprises a blower (3), protective shields (8) and gas flow management sheets(9).

11 Claims, 3 Drawing Sheets

METHOD FOR THE PLASMA ASSISTED HIGH VACUUM PHYSICAL VAPOR COATING OF PARTS WITH WEAR RESISTANT COATINGS AND EQUIPMENT FOR CARRYING OUT THE METHOD

BACKGROUND OF THE INVENTION

1. Field of the Invention

The invention concerns a method for the deposition of wear resistant coatings onto parts under high vacuum with plasma assisted physical vapor deposition. The carrying out of this method requires a particular type of equipment which is also subject of this invention.

2. Description of Related Art

Many methods for the physical vapor deposition were proposed over the last 30 years. Many of them have found widespread application since then. (see E. Bergmann and E. Moll: plasma assisted PVD coating technologies published in Surface Coatings and Technologies volume 37 (1989), pages 483 ff.). All these methods can be described as a combination of 3 process steps: conditioning, deposition, and deconditioning. Conditioning comprises in most cases several conditioning steps: cleaning, putting under high vacuum, heating and plasma etching. Deconditioning Comprises in most cases the deconditioning steps: cooling, removing from high vacuum and conservation. This sequence of steps is used in almost all methods for the plasma assisted high vacuum physical vapor coating of parts with wear resistant coatings. Exceptions are of course the coating of temperature sensitive parts, where one skips heating. Parts are considered as temperature sensitive, if they are not to be heated without damage to more than 650° K. The state of the art of conditioning for methods for the plasma assisted physical vapor coating of parts with wear resistant coatings has been described in the patent applications DE 3936550 and DE 104998. These two patent applications recommend putting the parts under high vacuum and radiation heating. In the case of radiation heating heat flows as a beam of infrared photons from a heater to the parts to be heated. A heater is a surface, whose temperature is higher than the temperature of the parts to be heated. The set point temperature is the temperature the parts should reach in the conditioning step.

The different variants of plasma etching are not discussed being not a subject of this invention. All plasma etching methods used today are executed under high vacuum although one could conceive rough vacuum methods.

Any physical vapor deposition can be considered as sequence of 3 processes each of them being stationary in time: Evaporation of components of the material that will form the coating in a suitable installation, called source. Transport of these components that will form the coating and, if appropriate, gaseous components to the parts. Conversion of these components on the surface of the parts to coatings with the required properties. Numerous forms of vapor sources are known and used today. (see E. Bergmann and E. Moll op. cit. ). In the case of the physical vapor deposition of wear resistant coatings they are based either on sputtering or on arc evaporation. The evaporated components for forming the coating are transported to the parts by a free molecular flow or by means of an electrostatically and/or electromagnetically managed molecular flow. Thereby a mass flow of components of the material constituting the coating is formed. The following transport configurations have been realized so far, each being specific to a certain equipment and vapor source configuration:

(1). A flat source facing a flat part: Not suitable for wear protection coatings, where most parts are complex shaped. Mainly used in load-lock systems.

(2). Flat sources on a cylinder and a radial mass flow to the parts in the center of the cylinder.

(3). Moving point sources or rod sources in the center and radial mass flow towards the components on the cylinder surface.

(4). Point source in the center or on the bottom and radial flow to the substrates mounted onto the segment of a sphere.

Flat sources are evaporation installations, where the components of the material that will form the coating are emitted from an extended surface and where this surface is flat. Point sources are evaporation installations where the components of the material, that will form the coating are emitted from a surface whose extension, typically in the range of 0.001–0.003 m. is very small compared to the vessel surface.. Rod sources are evaporation installations, where the components of the material, that will form the coating are emitted from a rod.

State of the art methods use radiation also for cooling of the parts.

State of the art methods for the plasma assisted high vacuum physical vapor coating of parts with wear resistant coatings use transport configurations with either parallel heat and mass flows or heat and mass flows, that are coradial. Coradial means both are in the radial direction of the same cylinder.

The reasons for the restriction to these transport configurations are considered evident. Under high vacuum heat flow in the form of a photon beam as well as mass flow of the components, that will form the coating, in the form of a molecular flow are directed flows. There sequential combination requires therefore a parallel or coradial direction of heat flow and mass flow, to assure equal uniformity of exposure of the parts to both flows. Since heat transport in high vacuum is limited to photons, the state of the art is limited to radiation heating.

The use of radiation heating brings many disadvantages in the practical application of these methods. Heat transport from the radiating surfaces to the core of the parts is poor, because it depends strongly on the surface finish of the parts and non-uniform temperatures can not be avoided: shading leaves some parts too cold, intensive irradiation overheats some parts. These problems arise from the fact, that the heat flow associated with radiation depends very strongly on the temperature difference between heater and part to be heated. The heat flow is proportional to the 4th power of this temperature difference. FIG. 1 shows the temperature evolution of 3 parts with different weight in different areas of an equipment with conditioning according to the state of the art. Curve (a) was measured with a twist drill made from H2 high speed steel, diameter 6 mm. fixed at half-height of the part carrier on a spindle at its periphery, loaded in a quiver executing a further rotation around its axis. Curve (b) was measured with a milling cutter, diameter 150 mm, length 200 mm, also fixed at half height of the part carrier on a spindle but free standing on a holder plate. Curve (c) was measured with a forming punch, diameter 300 mm, sitting in the center of the part carrier. The temperature of the heater was identical in all three experiments, namely 1270° K. The target temperature for all three parts was 770° K. The milling cutter reached this temperature after 2.5 hours. By that time the temperature of the twist drill had long exceeded his tempering temperature −810° K., the drill had softened and was scrap. The punch never reached his target temperature.

This lower than specified temperature of the punch during the subsequent coating step affected the adhesion of the plasma assisted coating adversely. In this experiment a heater temperature largely exceeding the target temperature of the parts had been chosen. In this way the light parts respectively the parts closer to the heater did exceed the target temperature and had approached the temperature of the heater, while heavy parts respectively parts at a larger distance from the heater had remained significantly below the target temperature. If one sets a small difference between heater temperature and target temperature, the heat flow becomes very small and the heating time excessively long.

These problems prevent currently the profitable coating of heavy parts with plasma assisted physical vapor deposition by job coaters. They also require from the operators of such equipment great skill in arranging mixed batches. The effect of the parallel or coradial arrangement of heat and mass flows leads to a heating of the part of similar non uniformity than the coating.

SUMMARY OF THE INVENTION

The subject of the invention is a method for the plasma assisted high vacuum physical vapor coating of parts with wear resistant coatings characterized by the fact, that the conditioning step heating is carried out with gas molecules and/or atoms as heat transport medium.

The problems of the state of the art coating processes can be solved if instead of photons gas atoms and/or molecules are used as energy carriers. This requires a gas flow from the heaters to the parts. The principle is known since centuries in bakeries and was introduced in the baking stoves in households in the last two decades. A radiation stove can only bake breads of equal or similar size, a convection stove is suitable for the simultaneous baking of biscuits and cakes. But the high vacuum of the evaporation process has a low gas density, which would make heating by gas extremely inefficient. This problem is overcome with a novel procedure: The chamber with the parts to be coated is first pumped down to fine vacuum, then refilled with a protective gas to a rough vacuum, which will be used for the conditioning by heating. Only when heating is completed will the chamber be put under high vacuum and the coating process will be continued either by the conditioning step of plasma etching or by high vacuum deposition. In principle any gas that will not react with the parts at the target temperature can be used as a protective gas. Mixtures of noble gases, nitrogen and/or hydrogen have proven well suited, in particular, mixtures, where nitrogen or helium are the main components.

Furthermore, we found, that configurations, where the heat flow is approximately orthogonal to the mass flow lead to particularly good results. Heating and cooling can be made much more uniform for most shapes of parts. The fact, that the method claimed makes heating more uniform than coating is not a disadvantage.

The heating with protective gases uses electrical energy and consists of a heater and a blower, that transports the protective gas from the heaters to the parts and back to the heaters. In the art of furnace design two variants of realization are known: In the case of external heating the blower sucks in the gas cooled down by the contact of the parts from the chamber and blows it over a heater, from where it again will flow across the chamber. Inlet and outlet fitting determine the heat flow. In the case of an internal heating conditioning space and heater space are separated by sheets incorporated in the chamber. A blower sucks the protective gas cooled down by the contact with the parts from the conditioning space and blows it over the heater in the heater space, from where it flows back into the conditioning space.

Both spaces are part of one same chamber.

Both variants of realization are state of the art for sintering furnaces but have never been proposed for use in the high vacuum vapor coating of parts with wear resistant coatings probably because they did not seem compatible with methods for the deposition of wear resistant coatings onto parts under high vacuum with physical vapor deposition. In the case of an external heating with protective gases the fine dust created continuously in the methods for plasma assisted high vacuum vapor coating of parts with wear resistant coatings would settle partly on the valve seats thereby making the chamber quickly unsuitable for high vacuum operation. In the case of an internal heating motors, that run in the chamber are used, because it seemed not possible to design high vacuum rotary feed-through compatible with the high rotation speeds of efficient blowers. Slowly rotating blowers do not produce a controlled gas flow. However since these motors run in the vacuum chamber emit copious amounts of gases they can not be used with methods of plasma assisted high vacuum vapor coating of parts with wear resistant coatings.

A further object of this invention is therefore a blower linked to a magnetic transmission, which is a preferred device for protective gas heating in processes of plasma assisted high vacuum vapor coating of parts with wear resistant coatings.

Similar considerations are valid for cooling. In this case the heater should be replaced by a gas/gas or gas/water heat exchanger. It is therefore a further object of the present invention to use the wall of the high vacuum vessel as a gas/water heat exchanger. A further part of the invention is the use of movable gas flow management sheets.

DESCRIPTION OF THE PREFERRED EMBODIMENTS

Figure 2:
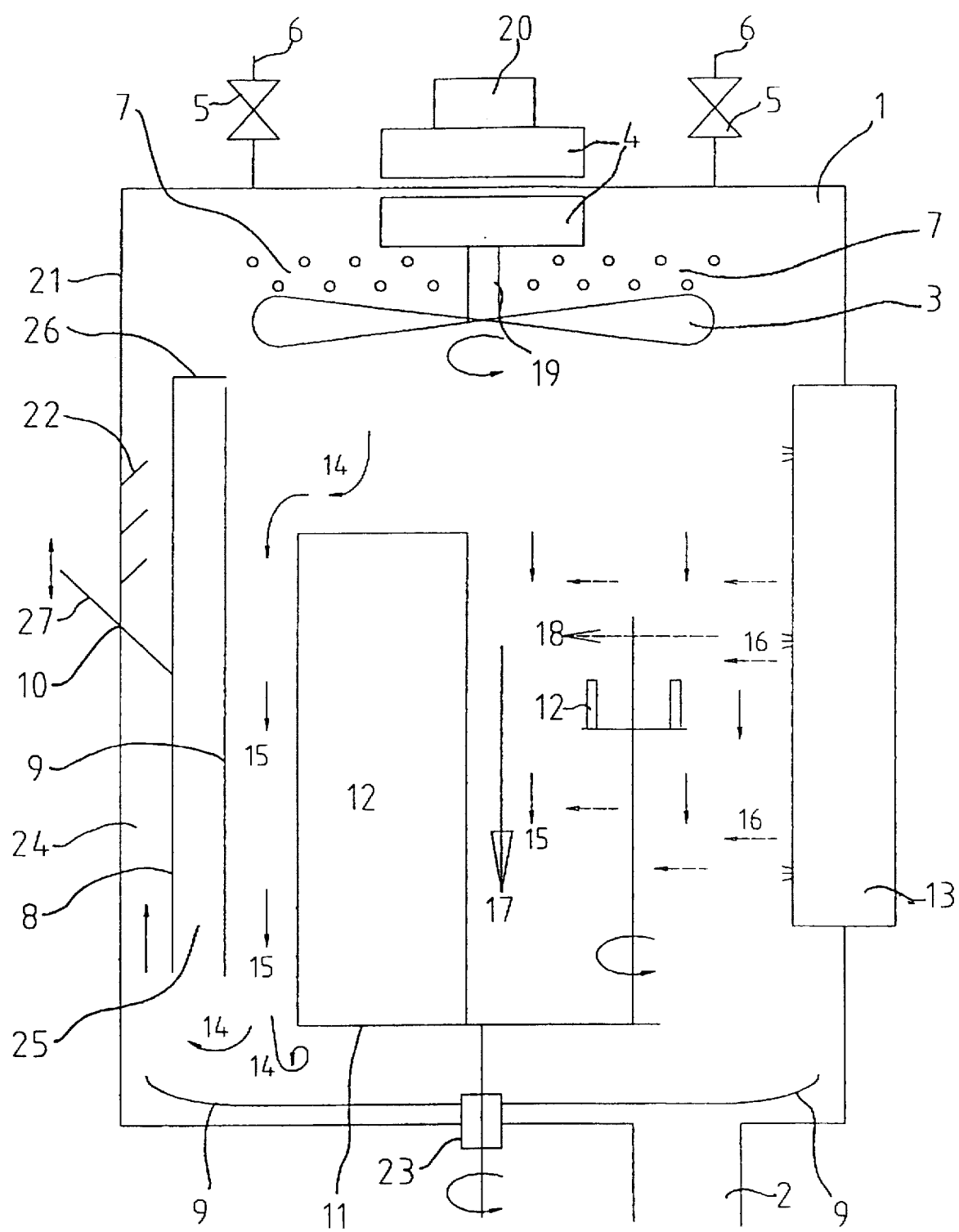
FIG. 2 is a diagrammatic illustration of a preferred apparatus of the invention.

The equipment for carrying out the process must comprise means for creating gas flows, preferably a blower, which in the preferred embodiment is driven through a magnetic clutch. The equipment comprises gas flow management sheets, which in the preferred embodiment also serve as heat flow barriers. They can be moved in a way to create a different gas flow during heating than during cooling. It was established, that the process efficiency increases, if the heaters are positioned close to the blower. Close means for example a disposition within the range of 50–200 mm. It will not be possible to place all the heating elements in this range for every equipment and installed heating power. What matters above all is the installation in the proximity of the blower intake. This disposition is made easy by the use of the magnetic clutch. Since with a magnetic clutch there are no lubricated parts in the vicinity of the blower, a higher temperature of the blower body can be tolerated. The following is the preferred sequence of process steps for the method claimed. After closing the high vacuum coating equipment a two stage mechanical pump creates a fine vacuum. During this process step no high vacuum pumps are used. The terms and definitions used correspond to W. Pupp, H. K. Hartmann Vakuumtechnik, Grundlagen und Anwendungen, Carl Hanser Verlag München 1991). A pressure of 5–10 Pascal is created. As soon as this pressure is reached, a valve is opened, bleeding protective gas into the chamber. If the pumping unit does not have sufficient pumping power in the range of 5–20 Pascal the following process sequence can be taken as an alternative: One creates only a pressure in the range of 100–1000 Pa., this corresponds to a rough vacuum, and provides ample rinsing of the equipment with protective gases, before the parts reach too high a temperature. In both versions a protective gas pressure of at least 0.01 bar is established. In the case, where one wants to coat ground shank type tools, a pressure in the range of 0.8–1 bar is used. If a more intense degassing of the parts is sought, for example with polished or honed tools, we found it advantageous to work at lower pressure at the expense of longer heat-up times. As soon as the target protective gas pressure is reached, the blower is put in operation creating a strong flow of protective gas. The flow of protective gas is taken in through heaters placed in the vicinity of the blower. A heat flow from the heaters to the parts is created. The direction of the heat flow corresponds to the direction of the gas flow. Very unexpectedly indeed, we found, that it is very advantageous if during heating in the space, where the parts are loaded the heat flow is essentially orthogonal to the mass flow, which will take place during high vacuum coating. By orthogonality of the two flows we mean, that the vector of the total gas flow (17) and the vector of the total mass flow (18) form an angle, that is essentially a right angle. FIG. 2 explains, how this rule must be applied. Because of flow deviations by the parts and whirls, the gas flow and therefore the heat flow may of course have locally (14) another even an opposite direction. But the majority of the flow lines (15) and therefore the macroscopic flow (17) will have a single and unique direction whose meaning is evident for a skilled person. Similar deviations have to be taken into account for the mass flow of the plasma assisted high vacuum evaporation processes. In these processes the mass flows is essentially directed (16) pointing away from the vapor sources. Since part of the vapor will be ionized, some electrostatic deviation will occur. Despite these deviations the application of the rule will be evident to anybody skilled in the art: It is a clear rule for the disposition of vapor sources, parts to be coated, and the disposition of blower and gas flow direction sheets. The details depend on the vapor sources selected and will be further detailed by the following 2 examples. If one chooses planar magnetrons and a cylindrical vessel one will incorporate the vapor sources in the cylinder side wall and reserve the chamber center for the parts just the way described e.g. in U.S. Pat. No. 4,877,505. In this case one should use the faces of the cylinder for the blowing (sucking) blower respectively the protective gas recirculation (feed) device. If one chooses a rod as vapor source as described in EP 508612, one will dispose the parts around this rod. In this case one will either use the two lateral walls of a rectangular chamber or two facing cylinder segments of a cylindrical chamber for blower and protective gas recirculation (feed) device. The reasons for this unexpected effect of improvement with orthogonal flows appear to be the following— although no completely satisfactory answer has been found so far: Shank type tools, which constitute the bulk of parts to be coated are usually loaded with their axis of revolution normal to the mass flow. If then the heat flow is parallel or coradial the heat intake of the parts is limited to the cylindrical half-face exposed to the heat flow. With an optimally tuned heating, the surface of this half-face will immediately reach the target temperature. Heat will then diffuse from this surface to the bulk of the tool. The form of the shank type tools will cause an orthogonal heat flow to be taken in on the whole cylinder face, whose surface will reach immediately the target temperature with an optimally tuned heating. In the framework of the validity of this simple model, one gets half the heating time for orthogonal flow when compared with parallel or coradial flow.

When the parts have reached the target temperature for the parts, the conditioning step heating is terminated. The energy input into the heaters is shut off. After that the blower drive is shut down.

All the plasma etching steps currently used are carried out under high vacuum (see E. Bergmann und E. Moll op. cit.). Under these circumstances the bleeding gas inlet will be closed after the shut down of the blower and the chamber will be pumped down to high vacuum with the high vacuum pumping device. High vacuum pumping devices are usually of the three stage type. A significant advantage of the method claimed when compared with state of the art methods is the fact that for a given high vacuum pumping device the time that elapses until high vacuum is reached is considerably shortened. In the state of the art methods the equipment is first pumped down to high vacuum before the conditioning step heating is started. In this case high vacuum must be produced in a cold or warmed up chamber. Usual high vacuum evaporation practice consists in warming the chamber up to 45° C. with water. The installations for this conditioning of the walls is significant (Usually 10–20% of the equipment costs). But this practice ignores the fact, that equipment for the plasma assisted high vacuum coating with wear resistant coatings is run in a different way than other high vacuum coaters. The thickness of the coatings deposited is relatively high, in the range of 2–10 µm for each batch. Since the parts are usually shank type or complex shaped, this coating thickness on the parts corresponds to a coating thickness deposited on the walls of 6–30 µm per batch. The usual applications of high vacuum deposition processes, from which the state of the art practice had been taken deposit 0.1 µm on flat parts. The pump down in a high vacuum equipment is determined by two different processes (Pupp und Hartmann op. cit.). Pumping down to fine vacuum is achieved by removing the gas filling the volume of the chamber. The transition from fine vacuum to high vacuum requires the removal of the gas adsorbed on the walls and surfaces. This leads to problems particular for equipment for plasma assisted high vacuum deposition of wear resistant coatings because of the large coating build-up on the walls involved. Since the kinetics of gas desorption are governed by Arrhenius' law, an economic operation requires for this application a transition from fine vacuum to high vacuum under high temperature. This fact was overlooked in the state of the art methods derived from the practice of high vacuum coating of other parts. The choice of a high temperature for the transition from fine vacuum to high vacuum, which is a subject of the present invention solves another problem, which is characteristic for processes where the heating step is carried out under protective gas. Chambers for such processes are equipped with protection shields between the chamber walls and the parts for reasons that will be detailed in the section of this patent description, where the equipment is discussed in detail. This requirement multiplies the surfaces covered with gas and would therefore handicap the economic operation of the equipment subject of the present invention, had we not found a method where the transition from fine vacuum to high vacuum takes place out under high temperature. When high vacuum has been achieved the selected plasma etching process is carried out followed by the selected high vacuum vapor deposition process.

Figure 1:
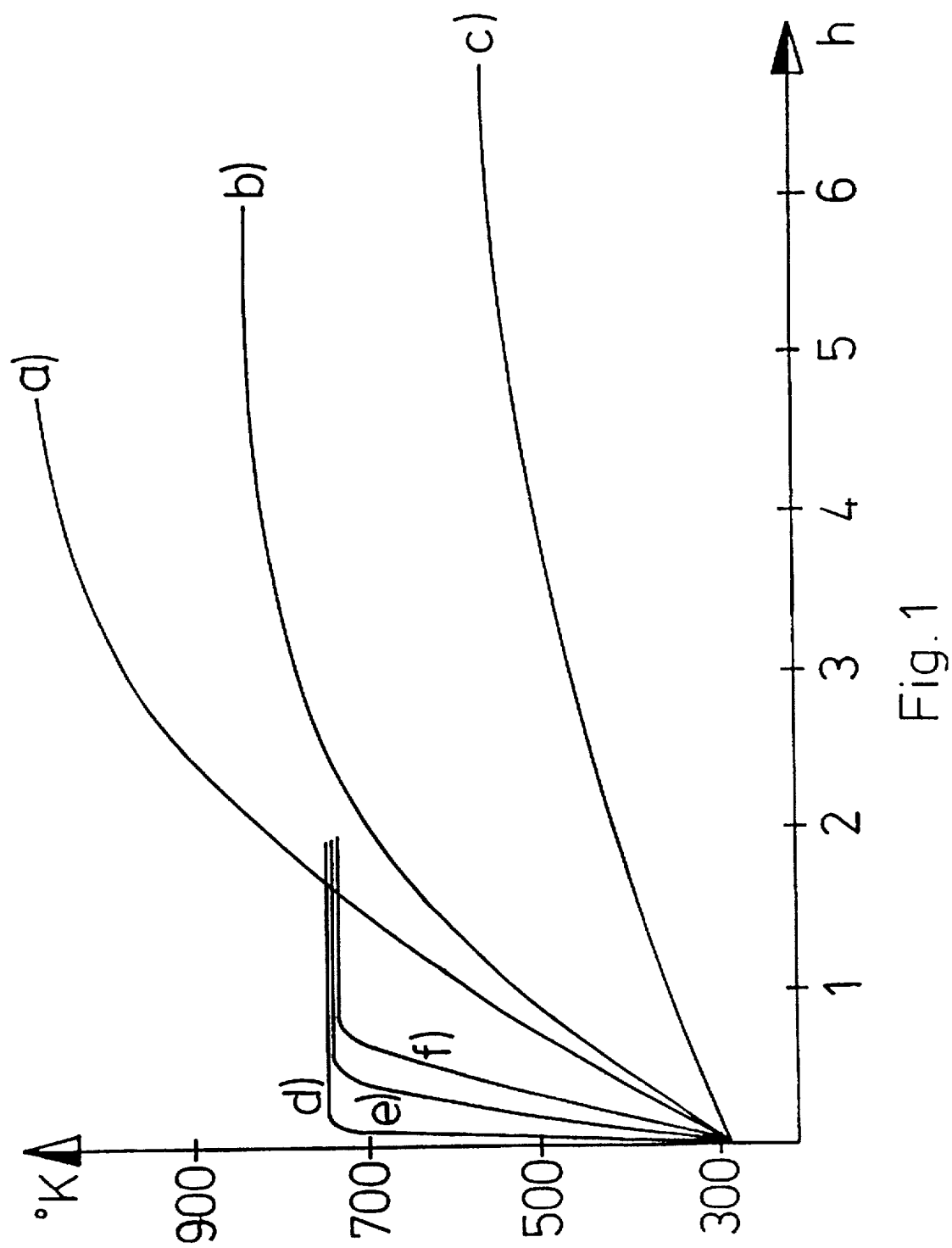
FIG. 1 is a graph showing the heat up of three different parts compared with the stat of the art.

FIG. 1 shows the heat-up of three different parts and the comparison with the state of the art, whose results have already been discussed. Curve (d) was measured with a twist drill, diameter 6 mm, mounted on the periphery of a rotating plate at half the height of the substrate carrier. Curve (e) shows the result for an end mill, diameter 150 mm, length 200 mm, also loaded on the periphery of the substrate carrier, but standing on the carrier plate. Curve (f) was measured with a forming punch, diameter 300 mm, loaded on the center of the substrate carrier. The temperatures of the heaters were the same in all three cases, namely 1170° K. The target temperature for the parts was 770° K. After 40 minutes even the most heavy part had reached the target temperature. None of the parts was overheated.

After the high vacuum vapor deposition process(es) the parts are subjected to a further conditioning step: cooling. Cooling is a conditioning step by which the temperature of the parts is brought down from the temperature after the coating step to another target temperature, the venting temperature. In the process of the present invention protective gas is used again for the heat transport in this conditioning step. For this purpose the chamber is back-filled again with protective gas up to a pressure between 0.5 and 1 bar. Following this, the blower is again put into operation and brought up to a rotating speed of at least 500 revolutions per minute, preferably to a rotation speed of 2000–2500 revolutions per minute. This is also the preferred rotation speed for heating. A change in the gas flow management device will now direct the flow along the chamber wall. As a consequence the chamber wall cools down the gas to the temperature close to the chamber wall cooling water. This cooled down gas is then blown or sucked over the parts by the blower. During this pass the gas cools down the parts picking up heat. To avoid overheating of the chamber cooling water during this process step, the blower rotational speed is regulated at least part of the time in the following way: A temperature sensor measures continuously the temperature of the chamber cooling water and transmits a corresponding signal, the actual value to the regulating unit. This unit compares the signal with the set value, that corresponds to a threshold of the temperature. This threshold temperature will depend on the design of the chamber water cooling unit. It will be in the range of 60°–95° C. When the signal reaches the threshold value, the regulating unit will reduce the rotation speed of the blower. When the signal is inferior to the threshold by a value corresponding to 5° C., the regulating unit starts increasing the rotation speed of the blower, until either the signal reaches again the threshold value or the rotation speed the set maximum. When the parts reach the venting temperature, the chamber is brought back to atmospheric pressure by opening the nitrogen bleeding valve followed by an opening of the air venting valve or simply by opening the air venting valve.

FIG. 2 shows a preferred embodiment of the invention

The vacuum vessel (1) is a cylindrical chamber (21) with the following dimensions: diameter 600 mm and height 800 mm. The relation between height and diameter reflects in the usual way the dimensions and quantities of the parts to be coated. On the chamber wall several rectangular cathodic arc evaporators (13) are mounted. The cathodic arc evaporators are of the externally mounted type of the state of the art design as it is described e.g. in DE 126040. The parts(12) are the parts to be coated by plasma assisted high vacuum physical vapor deposition. The holders carrying the parts consist of a carrying plate(11) with a feed-through (23) and a drive for the carrying plate which is not shown. Further details concerning the substrate holder can be taken from U.S. Pat. No. 4,485,759. The vessel is evacuated through the pumping port (2). He is fed with protective gas, a mixture of 10 volume % of hydrogen and 90 volume % of nitrogen through the valves (5). The admission duct for the protective gas and the reactive gases for the plasma assisted high vacuum vapor deposition process is designated by (6). The chamber lid is equipped with an axial blower (3), connected to the motor (20) by an axis (19) and the magnetic clutch (4). Details of the magnetic clutch are shown in FIG. 5. The heating elements are disposed in the immediate neighborhood of the blower. They heat up the protective gas before it is sucked in by the blower. The preferred embodiment allows the placing of the heating element in the top of the chamber in a space, where the distance to the fan ranged from 30 to 300 mm. The gas management sheets (9) and (8) direct the gas heated or cooled by the parts from the chamber bottom back to the chamber top. In the embodiment shown the lower gas management sheet was simply a dumb bell shaped vessel cylinder face of diameter 550 mm and 2 mm thickness. The two vertical sheets are cylinders with rectangular openings in the sections where the evaporator(s) is(are) fitted into the chamber wall. In the embodiment shown, their diameters were respectively 560 and 510 mm. The protection sheet (8) consists of a stack of 3 sheets. The chamber described therefore contained a total of 5 protection sheets between the parts and the chamber wall. One of the gas flow management sheets (8) can be moved to two positions opening or closing the channel (25) formed by sheet (8) and (9) to the protective gas flow. This is achieved by the shut off device (26). It is linked to a linear feed-through (10) connected to a lever (27), whose action produces a movement of the sheet (8) during the transition from the conditioning step heating to high vacuum or during the transition from high vacuum to the deconditioning step cooling or any time in between these two transitions. Other designs like chain drives or pneumatic cylinders are of course equally suitable. Other movements like rotations or opening or closing of traps can replace the lifting. During the conditioning step heating the gas management sheets are positioned in a way to produce a preferred flow of the protective gas between sheets (8) and (9) through the heating channel (25). During the deconditioning step cooling the two gas management sheets are in a position, that forces the protective gas flow through the cooling channel (24), formed by the chamber wall (21) and the gas management sheet (8). This cooling channel (24) can be equipped with cooling fins (22), to enhance the heat exchange between the chamber wall (21) and the protective gas.

Figure 3:
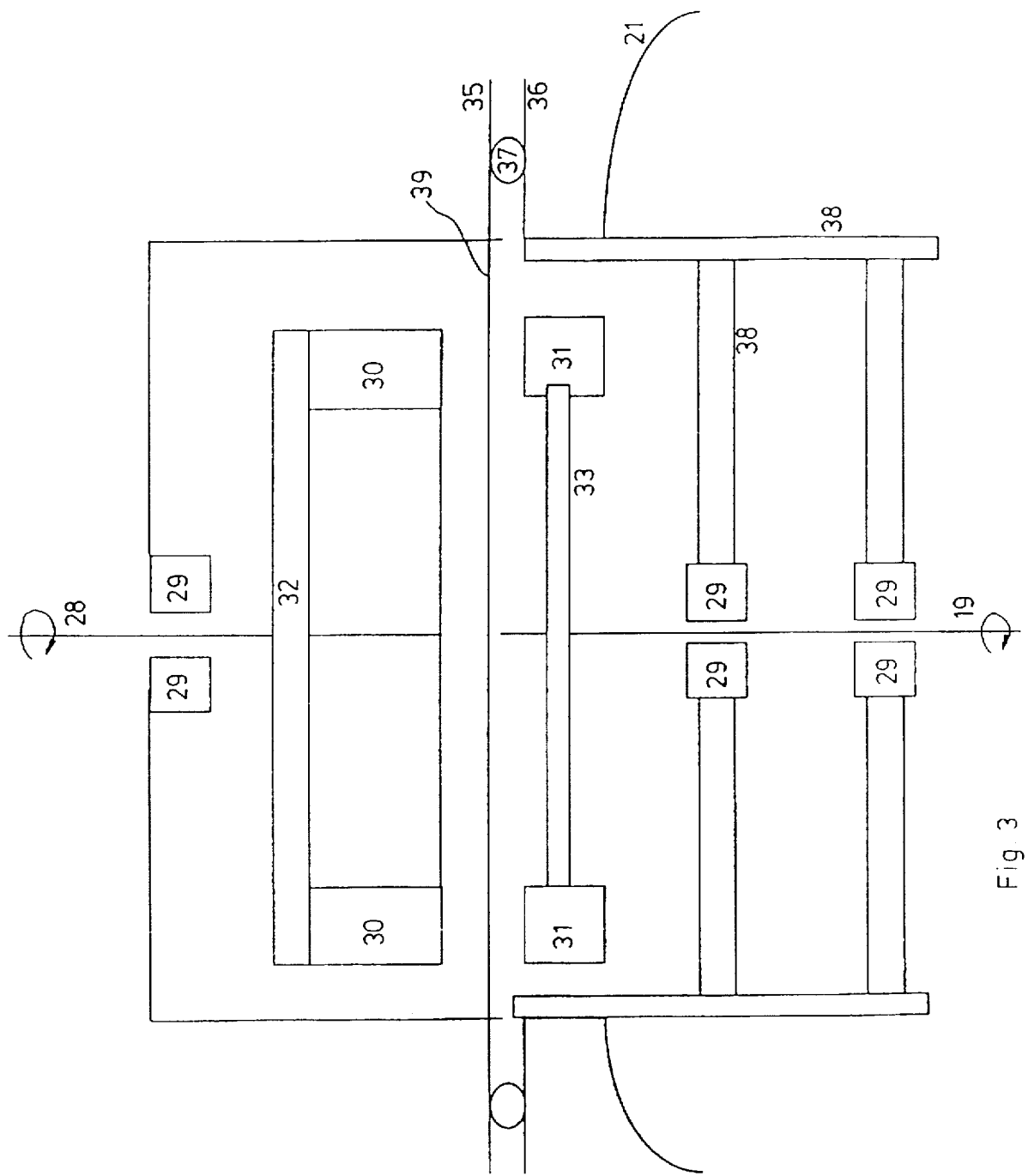
FIG. 3 shows a preferred embodiment of the magnetic clutch of the apparatus of the invention.

A preferred embodiment of the magnetic clutch is shown in FIG. 3. A pot with crossbeams(38) carrying two rolling bearings (29) is connected to the chamber flange (36). The pot contains the driven part of the clutch. The bearings support the blower shaft (19) which carries firmly linked to it a plate (33) separated from the chamber flange surface by a gap not exceeding 3 mm but superior to 0.2 mm. The periphery of this plate is connected to a ring(31), the driven ring. This ring consists either of permanent magnet material which is magnetized axially or of bars and fins of permanently magnetic material mounted in an appropriately designed yoke. The other side of the chamber flange is connected through a seal (37) with a pot (34), which carries the driving part of the clutch. The pot is equipped with at least one rolling bearing (29), whose inner ring is riveted to or coinciding with the shaft(28) of the motor, which is not shown. The shaft carries a yoke made from soft iron or another appropriate ferromagnetic material like a nickel or cobalt alloy. The yoke is linked to a ring of permanently magnetized material (30) which is designed in the same way as the driven ring (31). The design of the whole ensemble is executed in a way to maximize the attractive force between the driving and the driven parts of the clutch. In a preferred embodiment the yokes and the shapes of the permanent magnet material are such that the gap of 0.2–3 mm between the flange and the plate (33) and the thickness of the flange correspond essentially to the total air gap of the magnetic circuit. The mechanical design of the flange should be such, that the thickness of the membrane (39) in the gap does not exceed 2 mm. This thin membrane has to be properly supported to withstand the pressure of 1 bar. A preferred realization of the invention uses rings made from permanently magnetic material that are alloys of rare earths with cobalt or iron. A further preference in the realization of the embodiment of the invention uses alloys made essentially from the elements neodymium, iron and boron. The pot (34) is closed by a membrane made from stainless steel (39), whose thickness must not exceed 2 mm.

What is claimed is:

1. A method for plasma assisted high vacuum vapor coating of parts with a wear resistant coating in a chamber comprising closing said chamber, subjecting said parts to a conditioning process comprising a heating step, creating a medium or rough vacuum in said chamber, heating said parts to coating temperature by creating in said chamber an atmosphere of a heated protective gas that is inert to said parts at a pressure higher than a pressure of the medium or rough vacuum created during said preceding step, creating a high vacuum in said chamber upon completion of said heating step and coating said parts by plasma etching followed by high vacuum deposition of said wear resistant coating.

2. A method according to claim 1, wherein the protective gas transports heat to said parts during the heating step.

3. A method according to claim 1, wherein after said coating step, the parts are cooled by using a protective gas to transport heat from said chamber.

4. A method according to claims 1, 2 or 3 wherein a heater in said chamber is used to heat said protective gas and create a heat flow between said heater and said parts to be coated.

5. A method according to claims 1, 2 or 3 wherein the protective gas is circulated in said chamber by use of a blower.

6. A method according to claim 5, wherein the blower is rotated at a speed exceeding 500 revolutions/minute.

7. A method according to claim 6, wherein said blower is rotated at a speed exceeding 2000 revolutions/minute.

8. A method according to claim 1, wherein the heating step is followed either by a further conditioning step carried out under a medium or rough vacuum or by creating a high vacuum in the chamber.

9. A method according to claims 1, 2 or 3, wherein the pressure of the atmosphere of protective gas is higher than 0.01 bar.

10. A method according to claims 1, 2, or 3, wherein the protective gas is helium or nitrogen.

11. A method according to claims 1, 2, or 3 wherein the protective gas is renewed during said heating step by pumping off said protective gas and replacing it with a fresh source.

* * * * *